(12) United States Patent
Charaabi et al.

(10) Patent No.: US 11,557,823 B2
(45) Date of Patent: Jan. 17, 2023

(54) ANTENNA COMPONENT

(71) Applicant: Nokia Shanghai Bell Co., Ltd, Shanghai (CN)

(72) Inventors: Zied Charaabi, Lannion (FR); Azzeddin Naghar, Lannion (FR)

(*) Notice: Subject to any disclaimer, the term of this patent is extended or adjusted under 35 U.S.C. 154(b) by 176 days.

(21) Appl. No.: 17/160,538

(22) Filed: Jan. 28, 2021

(65) Prior Publication Data
US 2021/0234252 A1    Jul. 29, 2021

(51) Int. Cl.
| H01Q 1/24 | (2006.01) |
| H01Q 1/12 | (2006.01) |
| H01Q 1/38 | (2006.01) |
| H01Q 21/00 | (2006.01) |
| H05K 1/02 | (2006.01) |
| H05K 1/18 | (2006.01) |

(52) U.S. Cl.
CPC ......... H01Q 1/1242 (2013.01); H01Q 1/1207 (2013.01); H01Q 1/38 (2013.01); H01Q 21/0075 (2013.01); H05K 1/0243 (2013.01); H05K 1/181 (2013.01); H05K 2201/10098 (2013.01)

(58) Field of Classification Search
CPC .......... H01Q 1/12; H01Q 1/38; H01Q 21/00; H05K 1/02; H05K 1/18; H05K 2201/10098
See application file for complete search history.

(56) References Cited

U.S. PATENT DOCUMENTS

| 2,926,317 | A | 2/1960 | Blitz | |
| 9,083,068 | B2 * | 7/2015 | Jones | .................... H01Q 25/02 |
| 2004/0048420 | A1 * | 3/2004 | Miller | .................... H01P 3/084 |
| | | | | 438/106 |

FOREIGN PATENT DOCUMENTS

| CN | 106876851 | 6/2017 |
| CN | 108475835 | 8/2018 |
| EP | 0801433 | 9/2002 |
| JP | 2007317881 | 12/2007 |
| WO | WO 2012102576 | 8/2012 |
| WO | WO 2013105777 | 7/2013 |
| WO | WO2013105777 | 7/2013 |
| WO | WO 2020005298 | 1/2020 |

* cited by examiner

*Primary Examiner* — Andrea Lindgren Baltzell
(74) *Attorney, Agent, or Firm* — Capitol Patent & Trademark Law Firm, PLLC

(57) ABSTRACT

An apparatus is disclosed comprising first printed circuit board—PCB—and second PCB structure each having a first surface and a second surface and a layer of electrically conductive material on the first surface thereof and being attached to each other in a substantially parallel configuration. A stripline is positioned between the two PCBs. Each one of the first PCB and the second PCB has a plurality of via-holes that are electrically conductive and are connected at one end to the layer of electrically conductive material on the first surface and to an electrically conductive pad on the second surface of the PCB. At least a first electrically conductive pad associated with the first PCB is located in proximity with a first electrically conductive pad associated with the second PCB thereby forming a capacitive configuration.

20 Claims, 4 Drawing Sheets

ANTENNA COMPONENT

CROSS REFERENCE TO RELATED APPLICATIONS

This application claims priority to EP Application No: 20154396.4 having a filing date of Jan. 29, 2020 the contents of which are hereby incorporated by reference in their entirety.

TECHNICAL FIELD

This disclosure relates to antennas to provide different wireless services.

BACKGROUND

Acquiring new sites to place antennas for providing wireless service, especially for a wireless service that requires a new type of antenna, has become increasingly difficult in most dense urban areas. Also, the addition of new antennas supporting new frequency bands can result in very long, complex, and expensive negotiations with site owners. As a result, the deployment of active antenna systems (AAS), a key enabler of so-called "fifth generation"—(5G), wireless services, will likely be a major challenge for mobile network operators.

SUMMARY

Some embodiments feature an apparatus, comprising:
a first printed circuit board—PCB—structure having a first surface and a second surface and a layer of electrically conductive material on the first surface thereof;
a second PCB structure having a first surface and a second surface and a layer of electrically conductive material on the first surface thereof;
the first PCB structure and the second PCB structure being attached to each other in a substantially parallel configuration and a stripline being positioned therebetween;
each one of the first PCB and the second PCB having a plurality of via-holes provided in transversal direction relative to a plane of the first surface thereof, each via hole being electrically conductive and being connected at one end to the layer of electrically conductive material on the first surface and to an electrically conductive pad on the second surface thereof;
wherein at least a first electrically conductive pad associated with the first PCB is located in proximity with a first electrically conductive pad associated with the second PCB thereby forming a capacitive configuration.

According to some specific embodiments the electrically conductive pads are located at least on one lateral side of the stripline.

According to some specific embodiments the electrically conductive pads are located on opposite sides of the stripline.

According to some specific embodiments at least some of the electrically conductive pads are located in an area proximate to an input end of the stripline that is configured to receive signals to be transmitted by the antenna component.

According to some specific embodiments the at least some of the electrically conductive pads are located in an area proximate to an output end of the stripline that is configured to output signals to be transmitted by the antenna component.

According to some specific embodiments the electrically conductive pads are located in an area which is intermediate between an input end of the stripline that is configured to receive signals to be transmitted by the antenna component and an output end of the stripline that is configured to output signals to be transmitted by the antenna component.

According to some specific embodiments the first PCB is provided with varnish on its respective second surface and the second PCB is free of varnish on its respective second surface.

According to some specific embodiments the apparatus comprises a further electronic element provided at a location between an input end of the stripline that is configured to receive signals to be transmitted by the antenna component and an output end of the stripline that is configured to output signals to be transmitted by the antenna component.

According to some specific embodiments, wherein said electronic element is configured to prevent damaging interactions from existing radio networks with the apparatus.

According to some specific embodiments, wherein said electronic element is configured to protect existing radio networks from spurious energy emitted or received by the apparatus.

According to some specific embodiments, wherein the electronic element is a filter.

Some embodiments feature an antenna component comprising a first section having the shape of a pillar configured to convey signals to be transmitted and a second section located at an end of the pillar-shaped first section and configured to receive said signals and transmit said signals, wherein the first section comprises an apparatus according to the above embodiments.

Some embodiments feature an antenna array, comprising one or more antenna components according to the above embodiments wherein the one or more antenna components are configured to operate in a first frequency band, and one or more further antenna components configured to operate in a second frequency band, wherein the first frequency band is higher than the second frequency band.

According to some specific embodiments, the one or more antenna components and the one or more further antenna components are interleaved within the array.

According to some specific embodiments, the first frequency band is comprised in a group consisting of a range from about 3.3 GHz to about 4.2 GHz and a range from about 1.4 GHz to about 2.7 GHz; and the second frequency band is in a range from about 0.6 GHz to about 0.96 GHz.

DETAILED DESCRIPTION OF ILLUSTRATIVE EMBODIMENTS

As mentioned above, it has become increasingly challenging to find ways to deploy new active antenna systems—e.g. for 5G operations—on sites which are already crowded with other antenna arrays operating in other frequency bands, or to add such new active antennas onto structures already occupied by said other antennas.

Some solutions have been already proposed which implement a combination of active and passive antennas (APA) that permits to interleave 5G massive-multiple-input-multiple-output (mMIMO) antenna arrays within passive antenna structures. For example, WO2020005298 discloses one such solution which relates to an active-passive antenna arrangement in which an array of 5G active antennas is interleaved with multiband passive antenna structures. The 5G antenna array may be a mMIMO active array. The passive antenna structures may include low band (LB) antennas configured to fit within the space between the 5G antennas.

WO2020005298 discloses that the 5G radiating elements (antenna components) are placed on top of pillars at an optimized height with respect to the upper parts (tops) of the to the LB antennas thus avoiding, or at least minimizing, otherwise possible interactions, e.g. interferences, between the 5G and LB radiation patterns.

As used herein, LB frequencies may include for instance frequency bands from 0.6 to 0.96 GHz; whereas 5G frequencies may include for instance frequency bands from about 3.3 GHz to about 4.2 GHz, in particular from about 3.3 to about 3.8 GHz, or from about 3.4 to about 4.2 GHz.

Although 5G frequencies are considered herein for describing the various embodiments of the present disclosure, such consideration is not to be construed as limiting the scope of protection in any way, as other high band frequencies (HB), e.g. frequencies in a range between about 1.4 GHz and about 2.7 GHz band are also to be considered to fall within the scope of the present disclosure and the appended claims.

Figure 1:
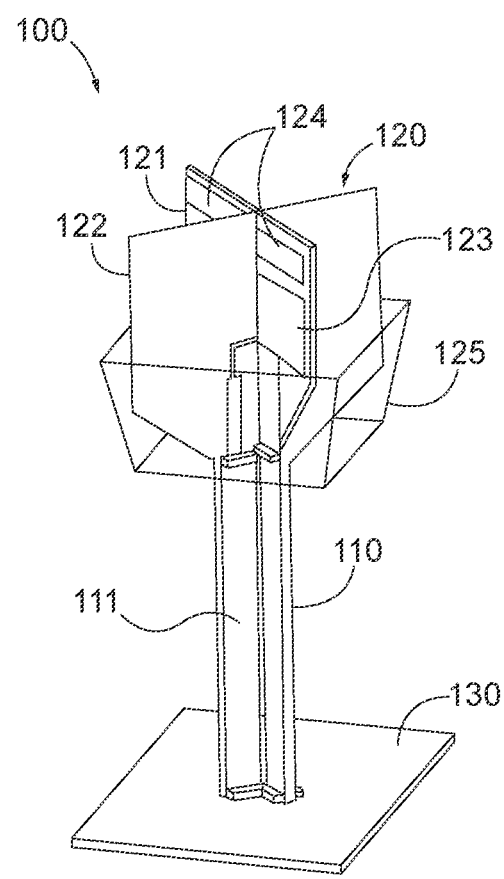
FIG. 1 is a schematic representation of an example of an antenna component.

FIG. 1 illustrates an example of a 5G antenna component 100 which is similar to the antenna component disclosed in WO2020005298. The antenna component 100 comprises a pillar section 110, a radiation section 120 and a base section 130.

The radiation section 120 may be a dual polarized structure composed of two dipoles 121, 122. Each dipole may be formed on a circuit board, and the two circuit boards are coupled together, e.g. at 90-degree angles, as shown. Each of the dipoles 121, 122 has thereon a pair of conductors 123 (only one is visible in the figure) that act as radiating elements; in this example 5G radiating elements. The conductors 123 are electrically coupled to conductors on the pillar section 110, which will be discussed further below.

The dipoles 121, 122 may optionally have additional conductors 124 which are not electrically connected to the dipole and may serve as an additional radiating line to increase the gain and bandwidth of the dipole, thus helping to shape radiation patterns and impedance matching.

The radiation section 120 may be mounted above a reflector element 125 which may be connected to ground.

The pillar section 110 may comprise two pillar structures 111 (only one is shown in FIG. 1). The use of two pillar structure allows for providing two polarizations in the antenna. Each pillar structure therefore feeds one of the dipoles 121 and 122 of the radiation structures 120 and each comprises two pillar elements that may be attached to each other, e.g. by glue. Further details regarding this antenna component may be found in the above-referenced WO2020005298.

Figure 2:
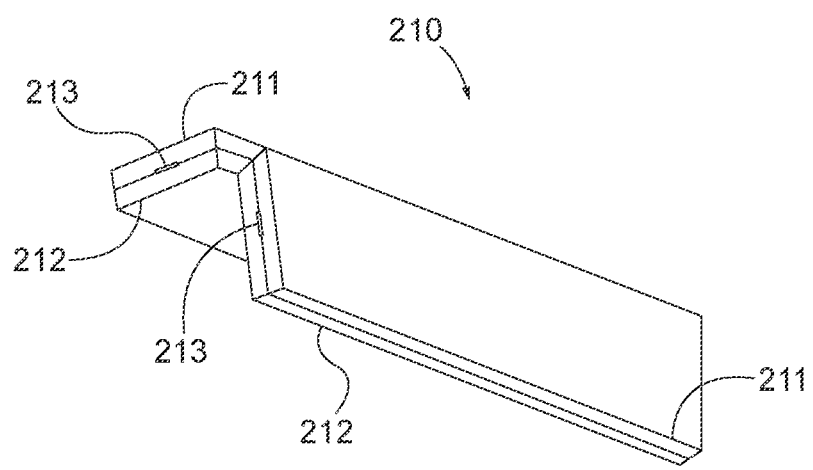
FIG. 2 is a schematic representation of a portion of the antenna component of FIG. 1.

FIG. 2 illustrates a section of an example pillar element 210 where two layers 211 and 212 are shown attached to each other along their respective flat surfaces. Each of the layers 211 and 212 may be made of printed circuit board (PCB). A stripline 213 (only an end thereof is shown in FIG. 2), serves the purpose of conducting the signals to be radiated to the conductors 123 of the dipoles 121, 122 of the radiation section 120 (FIG. 1). The stripline 213 is located—or sandwiched—between the two PCB layers 211 and 212. The use of a stripline, as compared to a microstrip, exhibits better performance in reducing RF (radio frequency) interactions and interferences between the neighboring radiating elements (i.e. the interleaved 5 g and LB antennas).

However, such arrangement of two PCBs sandwiching a stripline still suffers from the drawback of producing unwanted resonance (leaky modes) which disturb the performances of the 5G dipole.

To address this drawback, several methods of suppressing leaky modes may be employed. One such method may be to use shorting end-to-end via-holes between the two PCB layers provided adjacent the length of the stripline.

Figure 3:
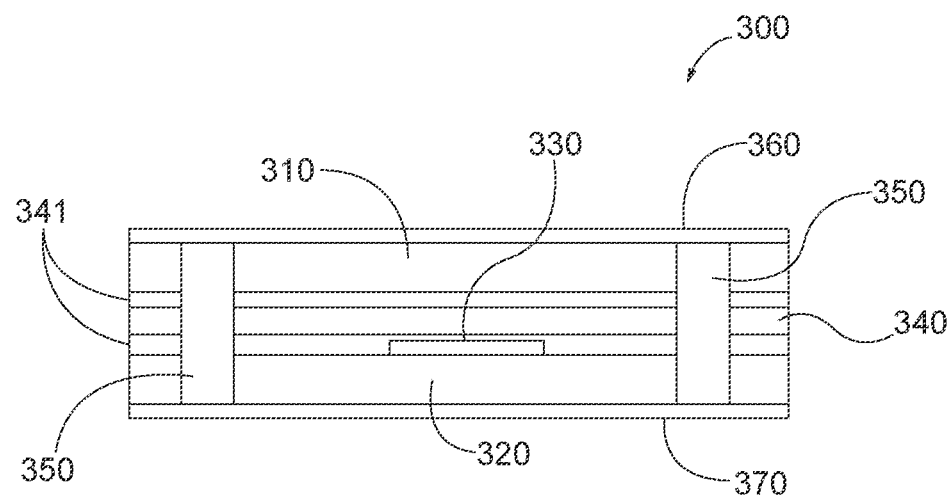
FIG. 3 is a schematic of FIG. 2.

FIG. 3. Illustrates a partial cross-sectional view of a double-PCB structure wherein such via-holes are incorporated. The structure 300 comprises a first PCB layer 310, and a second PCB layer 320 which together sandwich a stripline 330 and are attached together with an adhesive material 340, e.g. glue. The respective surfaces of the first PCB 310 and the second PCB 320 that are more proximate to the adhesive layer 340 may be varnished as show by layers 341.

As mentioned above, the double-PCB structure 300 has via-holes 350 that transverse the above-mentioned layers, typically in a direction which is perpendicular to the plane of layers 310 and 320, the latter planes being parallel to each other. The inner surface of each one of the via-holes is typically coated with a conductive material, such as for example copper or tinplate. These via-holes are typically provided in multiple locations adjacent and along the length of the stripline. Therefore, each double-PCB structure typically has a plurality of such via-holes in the body of the structure. The outer surface of the first PCB 310 (upper surface in FIG. 3) and the outer surface of the second PCB 320 (lower surface in FIG. 3) are each coated with electrically conductive material to serve as a ground layer 360 and 370, respectively. The via-holes 350 enable electrical connection between the two ground layers 360 and 370.

However, despite the efficiency of the end-to-end via-holes method, this solution remains costly and typically produces passive intermodulation (PIM) effects, which especially in case of a large mMIMO array, e.g. of (8×8×2) 128 pillars or (8×12×2) 192 pillars, is undesirable.

It is therefore desired to provide an antenna component for use in multiband passive-active antenna arrays, using the above mentioned stripline feeding solution, which can be made in a comparatively small size and which is capable of suppressing leaky modes while offering good RF performance, in particular by avoiding or reducing PIM effects.

The solution proposed herein provides such antenna component in which the end-to-end via-holes, as described with reference to FIG. 3, are replaced by a capacitive coupling of the unwanted leaky mode and interferences from the stripline to the ground.

Figure 4:
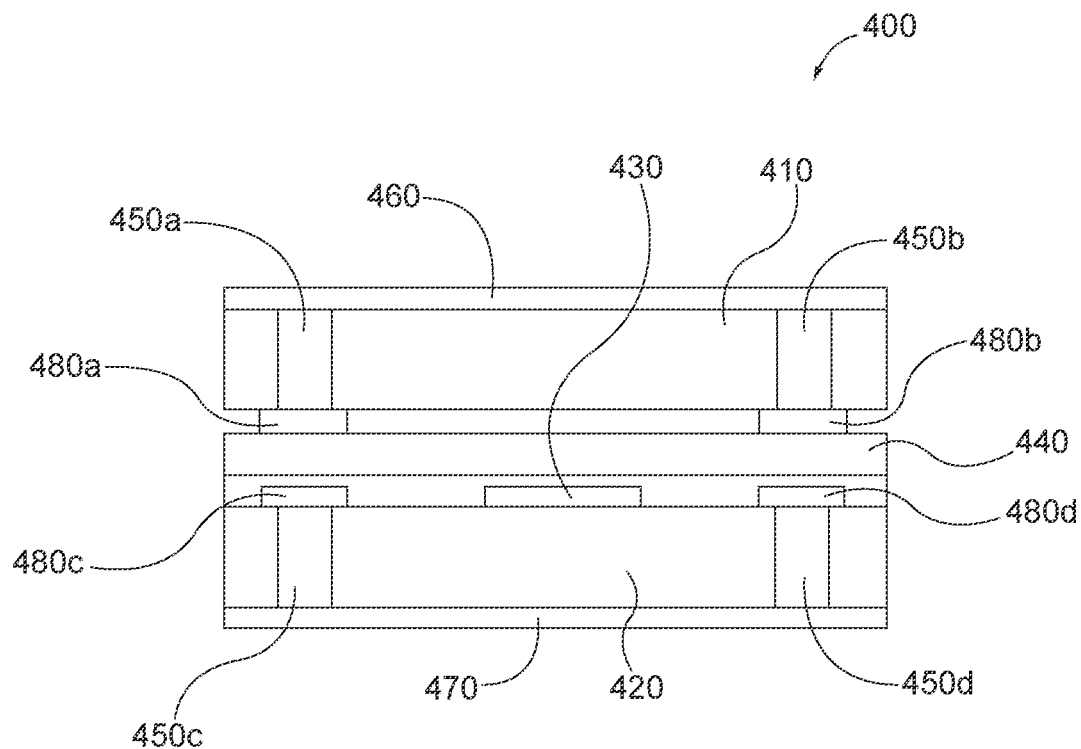
FIG. 4 is a schematic cross-sectional representation of a portion of an example of an antenna component according to some embodiments.

FIG. 4. Illustrates a partial cross-sectional view of a double-PCB structure according to some embodiments. The structure 400, similar in certain aspects to the structure of FIG. 3, comprises a first PCB layer 410, and a second PCB layer 420 which together sandwich a stripline 430 and are attached together with an adhesive material 440, e.g. glue. At least one of the respective surfaces of the first PCB 410 and the second PCB 420 more proximate to the adhesive layer 440 may be varnished as shown by layers 441. In FIG. 4 only the second PCB layer 420 is varnished.

The proposed double-PCB structure 400 also has via-holes 450a, 450b, 450c and 450d (collectively 450) which are provided in a direction perpendicular to the substantially parallel planes of layers 410 and 420, thus also in a perpendicular direction relative to the ground layers 460 and 470 that are provided on the respective outer surfaces of the two PCB layers 410 and 420.

However, different from the structure shown in FIG. 3, the via-holes 450 of the present disclosure are connected to coupling pads 480a, 480b, 480c and 480d (collectively 480). As shown, the via-hole 450a is connected to the pad 480a, the via-hole 450b is connected to the pad 480b, via-hole 450c is connected to the pad 480c, and the via-hole 450d is connected to the pad 480d. These pads may be made of electrically conductive material such as for example copper.

According to some embodiments, the pads 480 are provided on both sides of the stripline 430, as shown. Each pad 480 is in electrical contact with a respective ground plane 460 or 470 through a respective via-hole 450, or through a plurality of via-holes as will be seen with reference to FIG. 5. This electrical connection between the pads 480 and the ground planes 460 and 470 enables a capacitive coupling which allows for grounding, thus suppressing, any unwanted interference and leaky modes in the vicinity of the stripline 430. Indeed, pads 480a and 480c may be considered to form the two electrodes of a capacitor which would absorb such unwanted modes and sink them to ground planes 460 and 470 through via-holes 450a and 450c respectively. Similarly, pads 480b and 480d may be considered to form the two electrodes of a capacitor which would absorb the unwanted modes and sink them to ground planes 460 and 470 through via-holes 450b and 450d respectively.

In some example embodiments, such as the embodiment shown in FIG. 4, no varnish layer is provided on one of the PCBs, e.g. PCB 410 in order to enhance the coupling between the two ground planes 460 and 470. This is because in the absence of a level of varnish the gap between the two pads that form electrodes of a capacitor is reduced thus improving the coupling capability between the pads which in turn allows for better grounding of the unwanted modes.

The position and the size of the via-hole-pad pair (herein also referred to as via-pad) may be determined based on current distribution analysis. Furthermore, certain parameters may be optimized to improve the suppression of the leaky modes and thus avoid unwanted resonances in the voltage standing wave ration (VSWR).

Figure 5:
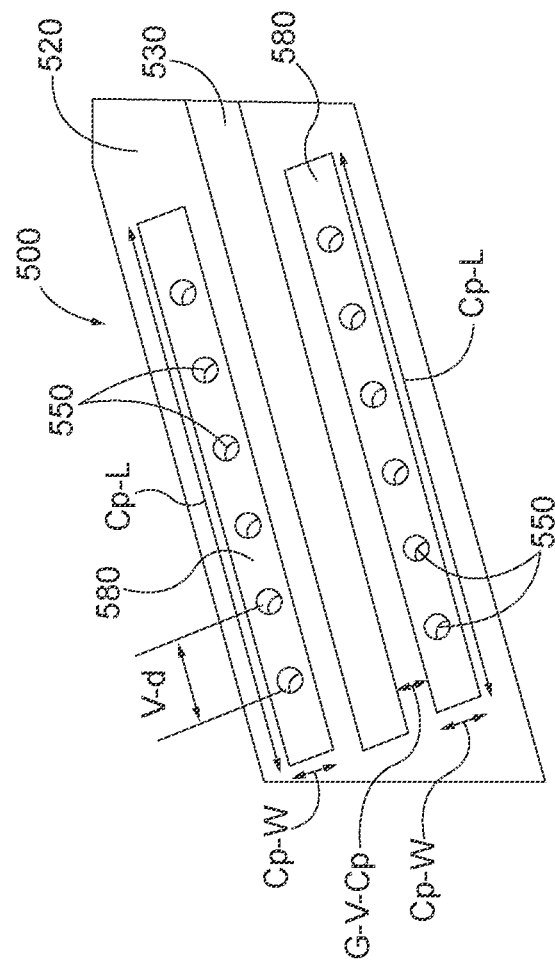
FIG. 5 is a schematic cross-sectional representation of a portion of an example of an antenna component according to some embodiments.

FIG. 5 illustrates a partial view of a PCB layer 500 where pads 580 can be seen on the surface of the layer 500. As can be seen, each pad 580 is located on one side of the stripline 530. A plurality of via-holes 550 can be seen in connection with each one of the pads 580. FIG. 5 also shows the above-mentioned parameters that can be optimized to enhance the leaky-mode suppression response of the structure 500. These parameters are:

V-d: distance between metalized via-holes;
Cp-L: length of the coupling pads 580;
Cp-W: width of the coupling pads 580;
G-V-Cp: gap between the stripline 530 and each one of the coupling pads 580.

Thus an optimization may be achieved by selecting positions and dimensions associated to the above parameters, such that they can contribute to achieving a better, or the best performance in suppressing unwanted modes.

Figure 6:
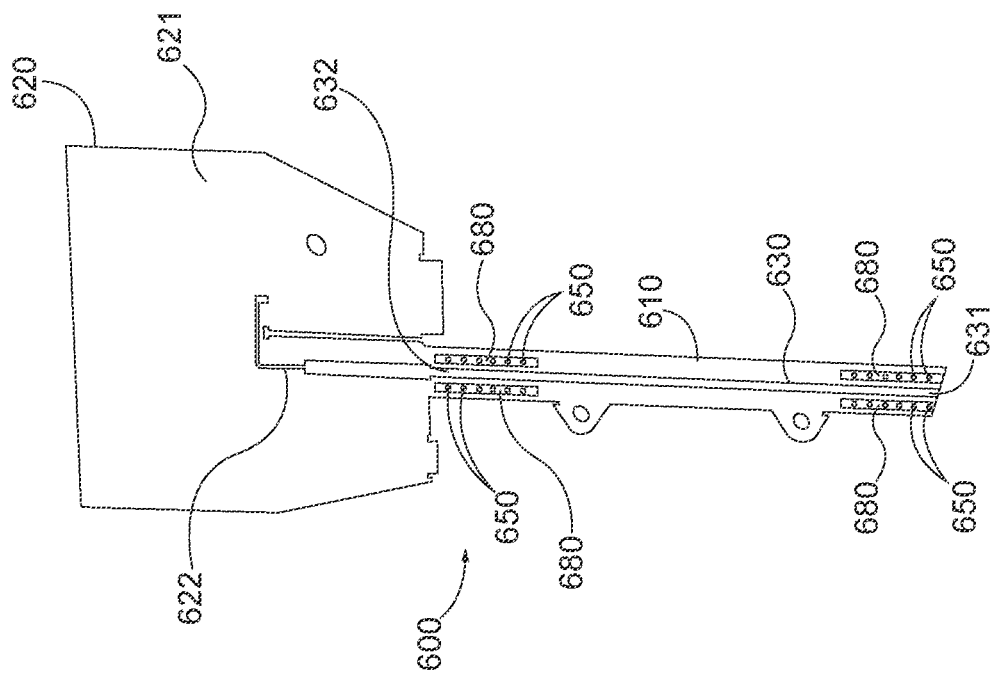
FIG. 6 is a schematic representation of a portion of an example of an antenna component according to some embodiments.

FIG. 6 shows certain (but not all) elements of a 5G antenna component 600 according to the embodiments of the disclosure. The antenna component 600 comprises a pillar section 610 and a radiation section 620 with only one PCB element 621 shown in the radiation section 620. The stripline 630 is provided along the length of the pillar section 610 and toward the radiation section 620 where it is connected to a conductive line 622 that feeds the radiation section 620. In this example, the stripline 630 has an input end 631 and an output end 632 which makes electric contact with the conductive line 622. The pads 680 are provided on both sides of the stripline 630 and are connected to via-holes 650.

As can be seen in the example embodiment of FIG. 6, the pads 680 are placed only in the vicinity of the input end 631 and the output end 632 of the stripline 630. While this arrangement allows for better suppression of leaky modes as described above, it also obviates the need for placing via-holes along the entire length of the stripline 630 without affecting the dipole pass-band. Another advantage of this arrangement is that the available unused area on the pillar section 610 which lies between the input end 631 and the output end 632 of the stripline 630 allows for incorporating additional electronic elements such as for example filtering features (not shown) at suitable locations along the length of the pillar section 610. Such filters may help to prevent potential damaging interactions from any existing radio networks with 5G antennas, as well as, or in the alternative, to protect any existing radio networks from potential spurious energy that might be emitted or received by 5G antennas. One example of such filtering features is described in WO2020005298.

Figure 7:
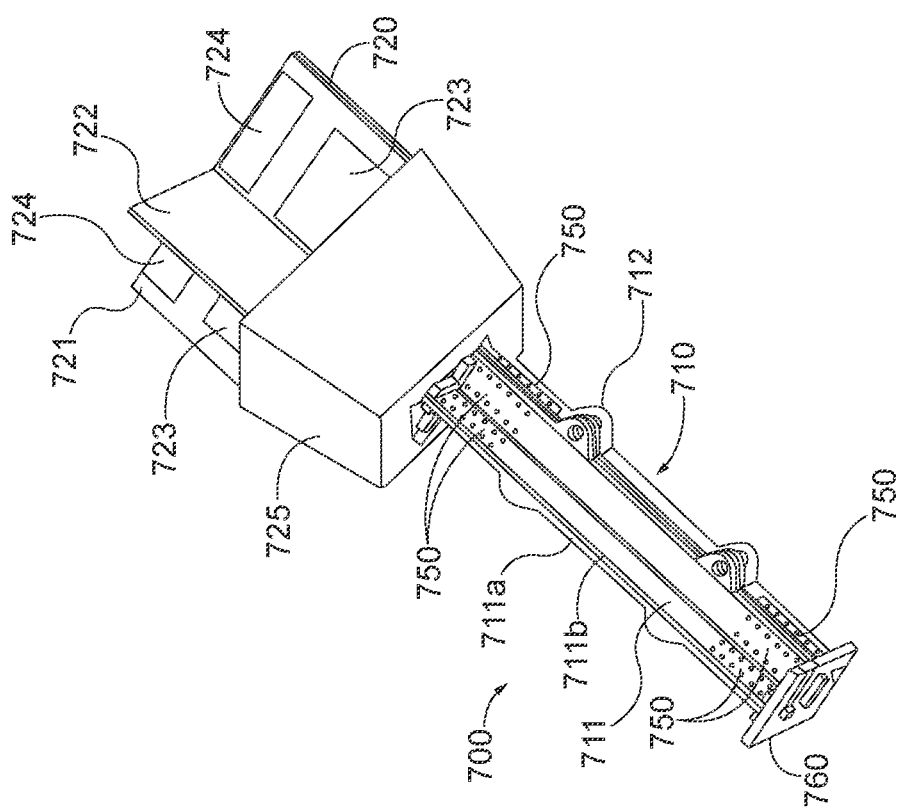
FIG. 7 is a schematic perspective view of an example of an antenna component according to some embodiments.

FIG. 7 shows an example of a completed 5G antenna component 700 according to embodiments of the disclosure. The antenna component 700 comprises a pillar section 710, a radiation section 720 and a base section 760.

The radiation section 720 has a dual polarized structure composed of two dipoles 721, 722. Each dipole may be formed on a circuit board, and the two circuit boards are coupled together, e.g. at 90-degree angles, as shown. Each of the dipoles 721, 722 has thereon a pair of conductors 723 that act as radiating elements for example for 5G transmission. The conductors 723 are electrically coupled to conductors on the pillar section 710.

The dipoles 721, 722 may optionally have additional conductors 724 which are not electrically connected to the dipole and may serve as an additional radiating line to increase the gain and bandwidth of the dipole, thus helping to shape radiation patterns and impedance matching.

The radiation section 720 may be mounted above a reflector element 725 which may be connected to ground.

The pillar section 710 comprises two pillar structures 711 and 712 which serve the purpose of enabling two polarizations in the transmission of the antenna. Each pillar structure 711, 712 therefore feeds one of the dipoles 721 and 722 of the radiation structures 720 and each comprises two pillar elements (e.g. 711a and 711b for pillar structure 711), attached to each other similar to the structure discussed with reference to FIG. 2.

Each pillar structure 711 also comprises a respective stripline (not explicitly shown) in a similar manner as described with reference to FIGS. 2 and 3.

As shown in FIG. 7, the pillar section 710 also comprises via-pad pairs 750 (the term pair referring to at least two via-pads forming a capacitive configuration) located in areas near the two ends of the pillar section 710, one end being an area of the pillar section 710 proximate to the base section 760 and another end being an area of the pillar section 710 proximate to the reflector element 725. This arrangement of the via-pad pairs 750 is similar to the arrangement shown in FIG. 6 where the via-pad pairs are located in the vicinity of the input end and the output end of the stripline. It is to be noted that in the example of FIG. 7, via-pad pairs 750 are provided on each one of the pillar structures 711 and 712.

Figure 8:
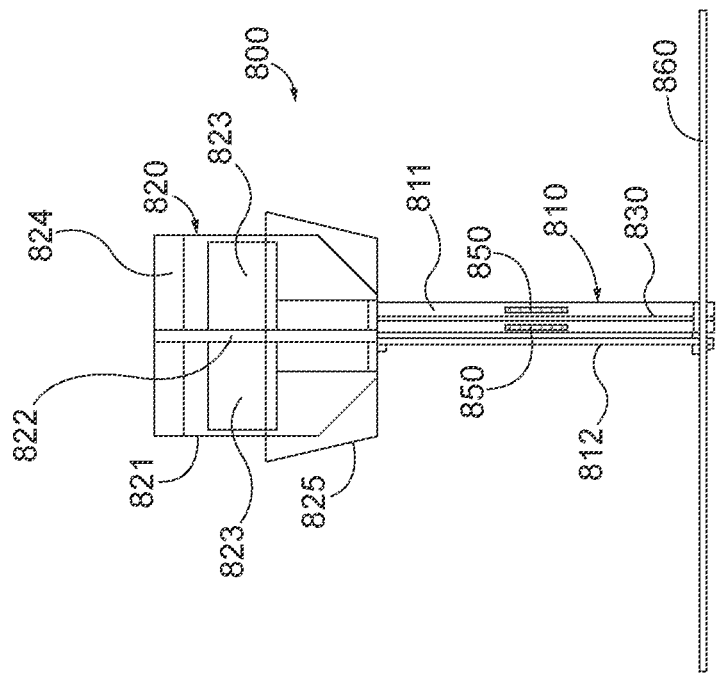
FIG. 8 is a schematic representation of a portion of an example of an antenna component according to some embodiments.

FIG. 8 illustrates an example of an antenna component according to some embodiments. Here also, the antenna component 800 comprises a pillar section 810, a radiation section 820 and a base section 860.

The radiation section 820 has a dual polarized structure composed of two dipoles 821 and 822 (the latter being in a plane perpendicular to the plane of the figure). Each dipole may be formed on a circuit board, and the two circuit boards are coupled together, e.g. at 90-degree angles, as shown. Each of the dipoles has thereon a pair of conductors 823 that act as radiating elements for example for 5G transmission. The conductors 823 are electrically coupled to conductors on the pillar section 810.

Optionally an additional conductor 824 may be provided on each dipole 821 which is not electrically connected to the dipole and may serve as an additional radiating line to increase the bandwidth of the dipole, thus helping to improve impedance matching.

The radiation section 820 may be mounted above a reflector element 825 which may be connected to ground.

The pillar section 810 comprises pillar structure 811 and 812 (the latter being in a plane perpendicular to the plane of the figure). Each pillar structure 811, 812 therefore feeds one of the dipoles 821 and 822 of the radiation structures 820 and each comprises two pillar elements in a similar fashion as described with reference to FIG. 7.

Each pillar structure 811 and 812 also comprises a respective stripline 830 (the other stripline on the pillar structure 812 is in a plane perpendicular to the plane of the figure) in a similar manner as described with reference to FIGS. 2, 3 and 7.

As shown in FIG. 8, the pillar section 810 also comprises via-pad pairs 850 located in an area near the center (or middle) of the length of pillar section 810. It is to be noted that in the example of FIG. 8, via-pad pairs 850 are also provided on the pillar structures 812, although not visible.

Based on simulations, the following non-limiting observations are provided:

1—In a first simulation with an antenna component similar to the one described with reference to FIG. 1, i.e. an antenna component without any via-pad pair implementation, a resonance at 4.2 GHz was observed.

2—In a second simulation, one via-pad pair placed at a location proximate to the center of the pillar section (i.e. halfway between the two ends thereof) proved to be enough to eliminate the unwanted resonances within the useful frequency band.

3—In a third simulation, two via-pad pairs were used, one at the end of the pillar section proximate to the base (i.e. adjacent the input of the stripline,) and the other one at the other end of the pillar section proximate to the reflector element (i.e. adjacent at its output) which is similar to the embodiment shown in FIG. 7. In this simulation, a better configuration to suppress the leaky modes within the stripline was observed. This is mainly because the solution proposed in this case allows for suppressing the leaky modes at the input and output of the stripline (i.e. the two ends of the pillar section). Furthermore, it permits to add filtering features at the center of the pillar as mentioned above.

In this manner, an antenna component is provided which is suitable for 5G radiation, and which can be interleaved with LB antenna components and further it can:

Avoid or substantially reduce radiation patterns degradation of 5G radiating elements.

Avoid or substantially reduce resonances and/or degradation of 5G radiating elements VSWR.

Improve the PIM level of 5G radiating elements.

Furthermore, the solution proposed herein is scalable for a variety of different frequency bands as long as suitable design parameters are taken into consideration.

The various embodiments of the present disclosure may be combined as long as such combination is compatible and/or complimentary.

Further it is to be noted that the list of structures corresponding to the claimed means is not exhaustive and that one skilled in the art understands that equivalent structures can be substituted for the recited structure without departing from the scope of the claimed invention.

It should be appreciated by those skilled in the art that any block diagrams herein represent conceptual views of illustrative circuitry embodying the principles of the disclosure.

The invention claimed is:

1. An apparatus, comprising:
a first printed circuit board (PCB) structure having a first surface and a second surface and a layer of electrically conductive material on the first surface thereof;
a second PCB structure having a first surface and a second surface and a layer of electrically conductive material on the first surface thereof;
the first PCB structure and the second PCB structure being attached to each other in a substantially parallel configuration and a stripline being positioned therebetween;
each one of the first PCB and the second PCB having a plurality of via-holes provided in transversal direction relative to a plane of the first surface thereof, each via hole being electrically conductive and being connected at one end to the layer of electrically conductive material on the first surface and to an electrically conductive pad on the second surface thereof;
wherein at least a first electrically conductive pad associated with the first PCB is located in proximity with a first electrically conductive pad associated with the second PCB thereby forming a capacitive configuration.

2. The apparatus of claim 1 wherein the electrically conductive pads are located at least on one lateral side of the stripline.

3. The apparatus of claim 2 wherein the electrically conductive pads are located on opposite sides of the stripline.

4. The apparatus of claim 1 wherein at least some of the electrically conductive pads are located in an area proximate to an input end of the stripline, the input end of the stripline being configured to receive signals to be transmitted by the antenna component.

5. The apparatus of claim 1 wherein at least some of the electrically conductive pads are located in an area proximate to an output end of the stripline, the output end of the stripline being configured to output signals to be transmitted by the antenna component.

6. The apparatus of claim 1 wherein the electrically conductive pads are located in an area which is intermediate between an input end of the stripline that is configured to receive signals to be transmitted by the antenna component and an output end of the stripline that is configured to output signals to be transmitted by the antenna component.

7. The apparatus of claim 1 wherein the first PCB is provided with varnish on its respective second surface and the second PCB is free of varnish on its respective second surface.

8. The apparatus of claim 1 further comprising a further electronic element provided at a location between an input end of the stripline that is configured to receive signals to be transmitted by the antenna component and an output end of the stripline that is configured to output signals to be transmitted by the antenna component.

9. The apparatus of claim 8, wherein said electronic element is configured to prevent damaging interactions from existing radio networks with the apparatus.

10. The apparatus of claim 8 wherein said electronic element is configured to protect existing radio networks from spurious energy emitted or received by the apparatus.

11. The apparatus of claim 8 wherein the electronic element is a filter.

12. An antenna component comprising a first section having the shape of a pillar configured to convey signals to be transmitted and a second section located at an end of the pillar-shaped first section and configured to receive said signals and transmit said signals, wherein the first section comprises an apparatus according to claim 1.

13. An antenna array, comprising at least one antenna component according to claim 12 wherein the at least one antenna component is configured to operate in a first frequency band, and at least one further antenna component configured to operate in a second frequency band, wherein the first frequency band is higher than the second frequency band.

14. The antenna array of claim 13, wherein the at least one antenna component and the at least one further antenna component are interleaved within the array.

15. The antenna array of claim 13, wherein:
the first frequency band is in a range of one of the group of ranges consisting of a range from about 3.3 GHz to about 4.2 GHz and a range from about 1.4 GHz to about 2.7 GHz; and
the second frequency band is in a range from about 0.6 GHz to about 0.96 GHz.

16. An apparatus, comprising:
a first printed circuit board (PCB) structure having a first surface and a second surface and a layer of electrically conductive material on the first surface thereof;
a second PCB structure having a first surface and a second surface and a layer of electrically conductive material on the first surface thereof;
a stripline positioned between the first PCB structure and the second PCB structure;
wherein the first PCB structure and the second PCB structure are attached to each other in a substantially parallel configuration with the stripline therebetween;
the first PCB having a plurality of first via-holes provided in transversal direction relative to a plane of the first surface thereof, each first via-hole from the plurality of the first via holes being electrically conductive and being connected at one end to the layer of electrically conductive material on the first surface of the first PCB and to a respective first electrically conductive pad of a plurality of first electrically conductive pads on the second surface of the first PCB;
the second PCB having a plurality of second via-holes provided in transversal direction relative to a plane of the first surface thereof, each second via-hole from the plurality of the second via holes being electrically conductive and being connected at one end to the layer of electrically conductive material on the first surface of the second PCB and to a respective second electrically conductive pad of a plurality of second electrically conductive pads on the second surface of the second PCB;
wherein at least one of the plurality of first electrically conductive pads of the first PCB is located in proximity of at least one of the plurality of second electrically conductive pads associated with the second PCB so as to form a capacitor.

17. The apparatus of claim 16 wherein the at least one of the plurality of first electrically conductive pads of the first PCB that is located in proximity to the at least one of the plurality of second electrically conductive pads associated with the second PCB so as to form a capacitor are located at least on one lateral side of the stripline.

18. The apparatus of claim 17 wherein the at least one of the plurality of first electrically conductive pads of the first PCB and the at least one of the plurality of second electrically conductive pads associated with the second PCB are respectively located on opposite sides of the stripline and in proximity to each other, so as to form a capacitor.

19. The apparatus of claim 1 wherein the at least one of the plurality of first electrically conductive pads of the first PCB and the at least one of the plurality of second electrically conductive pads associated with the second PCB are located in an area proximate to an input end of the stripline so as to form a capacitor, the input end of the stripline being configured to receive signals to be transmitted by the antenna component.

20. The apparatus of claim 1 wherein the at least one of the plurality of first electrically conductive pads of the first PCB and the at least one of the plurality of second electrically conductive pads associated with the second PCB are located in an area proximate to an output end of the stripline so as to form a capacitor, the output end of the stripline being configured to output signals to be transmitted by the antenna component.

* * * * *